United States Patent
Courteille et al.

(10) Patent No.: US 9,326,410 B2
(45) Date of Patent: Apr. 26, 2016

(54) REMOVABLE COMMUNICATION CARTRIDGE THAT CAN BE DETACHED FROM AN EQUIPMENT, EQUIPMENT, ASSEMBLY AND SYSTEM CORRESPONDING THERETO

(75) Inventors: Jean-Marie Courteille, Boulogne-Billancourt (FR); Pierre Guivarch, Boulogne-Billancourt (FR); Francois Guillot, Boulogne-Billancourt (FR); Bruno Larois, Boulogne-Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 282 days.

(21) Appl. No.: 14/232,873

(22) PCT Filed: Jul. 12, 2012

(86) PCT No.: PCT/EP2012/063652
§ 371 (c)(1),
(2), (4) Date: May 30, 2014

(87) PCT Pub. No.: WO2013/010899
PCT Pub. Date: Jan. 24, 2013

(65) Prior Publication Data
US 2014/0292074 A1 Oct. 2, 2014

(30) Foreign Application Priority Data
Jul. 15, 2011 (FR) ...................................... 11 56453

(51) Int. Cl.
*B60R 16/03* (2006.01)
*H05K 7/10* (2006.01)
(Continued)

(52) U.S. Cl.
CPC *H05K 7/10* (2013.01); *B60R 16/03* (2013.01); *H05K 5/026* (2013.01); *H05K 5/0278* (2013.01); *H05K 5/0282* (2013.01); *H05K 5/0286* (2013.01); *H05K 7/1421* (2013.01)

(58) Field of Classification Search
None
See application file for complete search history.

(56) References Cited

U.S. PATENT DOCUMENTS 5,727,110 A * 3/1998 Smith ...................... G01R 1/04
361/728
6,331,936 B1 * 12/2001 Hom ..................... G06F 1/1616
361/679.55

(Continued)

OTHER PUBLICATIONS

French Search Report or French Application No. 1156453 dated Apr. 17, 2012. 2 pages.

*Primary Examiner* — Hoa C Nguyen
*Assistant Examiner* — Xanthia C Cunningham
(74) *Attorney, Agent, or Firm* — Blakely Sokoloff Taylor & Zafman LLP

(57) ABSTRACT

The invention relates to a communication cartridge (1) characterized in that—it is adapted to be integrated in a removable manner into a recess (25) of a host equipment (2), during normal operation, an external front part (13) of the cartridge being intended to be external to the recess (25) of the host equipment (2), and in that—it comprises at least one front port, placed in an internal space of the cartridge (1) and intended to cooperate with a wireless communication module also placed in the internal space of the cartridge (1), during normal operation, the front port being moreover adapted to have an adjustable position in the internal space, so that the module is at least partially positioned in the external front part (13) of the cartridge (1), during normal operation. The invention also relates to an equipment, an assembly and a system corresponding thereto.

14 Claims, 4 Drawing Sheets

Figure 1:
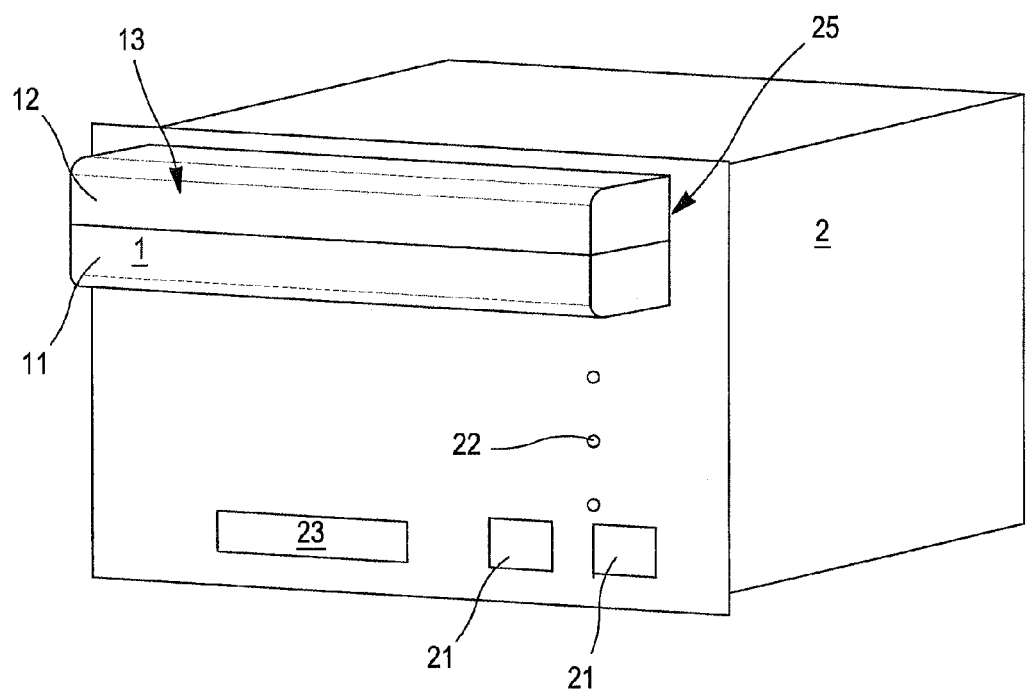

(51) Int. Cl.
*H05K 5/02* (2006.01)
*H05K 7/14* (2006.01)

(56) References Cited

U.S. PATENT DOCUMENTS

| | | | | |
|---|---|---|---|---|
| 6,435,904 B1 * | 8/2002 | Herbst | ............... | H01R 13/6315 |
| | | | | 439/534 |
| 6,611,424 B2 * | 8/2003 | Huang | ............... | H05K 7/1421 |
| | | | | 248/224.51 |
| 6,776,345 B1 | 8/2004 | Liang | | |
| 7,255,582 B1 * | 8/2007 | Liao | ............... | H01R 25/006 |
| | | | | 439/165 |
| D561,687 S * | 2/2008 | Sween | ............... | D13/110 |
| 7,327,580 B2 * | 2/2008 | Ruque | ............... | H05K 7/1441 |
| | | | | 361/735 |
| 7,967,610 B2 * | 6/2011 | Lynch | ............... | H01R 13/6271 |
| | | | | 361/679.32 |
| 7,996,613 B2 * | 8/2011 | Wang | ............... | G06F 13/4234 |
| | | | | 711/115 |
| 8,345,428 B2 * | 1/2013 | Nielsen | ............... | H05K 7/1461 |
| | | | | 361/729 |
| 2002/0001989 A1 * | 1/2002 | Friesen | ............... | H01R 13/6215 |
| | | | | 439/362 |
| 2002/0078297 A1 | 6/2002 | Toyama et al. | | |
| 2004/0235327 A1 * | 11/2004 | Weng | ............... | G06F 1/1616 |
| | | | | 439/188 |
| 2006/0131431 A1 * | 6/2006 | Finn | ............... | G06K 19/041 |
| | | | | 235/492 |
| 2008/0233870 A1 | 9/2008 | Budde | | |
| 2011/0215759 A1 * | 9/2011 | Lee | ............... | G06F 1/266 |
| | | | | 320/115 |
| 2011/0309727 A1 * | 12/2011 | Kano | ............... | H05K 7/1461 |
| | | | | 312/223.2 |

* cited by examiner

# REMOVABLE COMMUNICATION CARTRIDGE THAT CAN BE DETACHED FROM AN EQUIPMENT, EQUIPMENT, ASSEMBLY AND SYSTEM CORRESPONDING THERETO

GENERAL TECHNICAL FIELD

The present invention relates to a communication cartridge that is removable from equipment, a piece of equipment, a corresponding assembly and a system.

STATE OF THE ART

Wireless communication modules (according to the 3G standard, for example) are known which are specifically manufactured by original equipment manufacturers (OEM) to be incorporated into on-board host equipment, such as for example an avionics data acquisition, processing and communication unit of an aircraft.

However, aforementioned assemblies consisting of at least one module and a piece of equipment have deficiencies.

The specific host equipment is certified and qualified for the specific integrated modules, and the latter cannot evolve synchronously with the technology. The assembly is therefore subject to repeated obsolescence.

In the event of a change of technology of the modules, the equipment must be the subject of a new certification and qualification, because the specifications, the interfaces and the mechanical footprints of the modules are proprietary (the communication modules are in fact specifically manufactured by OEMs and are therefore not standardized).

Moreover, the maximum number of modules for each piece of on-board equipment is fixed, and it is therefore not possible to add a module to a piece of equipment if the maximum number of modules incorporated into the equipment has already been reached.

It is however not possible to use known standard and commercially available wireless communication modules, particularly in the case of an aircraft, because the problems of
mechanical integration,
computer security management, such as for example the installation of driver programs or communications security,
environmental qualification,
safety, such as for example avoiding electromagnetic radiation in flight, or
obsolescence management are too constraining.

PRESENTATION OF THE INVENTION

The invention proposes to correct at least one of these deficiencies.

To this end, a communication cartridge is proposed according to the invention that is characterized in that it is configured to be integrated in a detachable manner into a recess in a piece of host equipment, in normal operation, a front outer portion of the cartridge being configured to be outside the recess in the host equipment, and in that it comprises at least one front port, placed in an internal space of the cartridge and configured to cooperate with a wireless communication module also placed in the internal space of the cartridge, in normal operation, the front port being also configured to have an adjustable position in the internal space, such that the modules is at least partially positioned in the front outer portion of the cartridge, in normal operation.

The invention is advantageously supplemented by the following features, taken alone or in any one of their technically possible combinations:
the cartridge has a base and a lid cooperating mechanically with the base to open and/or close the cartridge;
it comprises a rear connector placed in the internal space and adapted through the cartridge to cooperate with a connector of the recess, and the front port comprises a connector mounted in translation in the internal space and connected to the rear connector by a flexible cable;
it comprises a module blocker longitudinally aligned with the front port;
it comprises a display device on the front outer portion;
the front port is a USB port or a PCIe port;
the cartridge comprises an identification logic for the cartridge;
the front outer portion comprises a recess external to the cartridge, for the insertion of an antenna external to a module, and/or a connector for an external antenna.

The invention also relates to a piece of equipment that is host to the cartridge, an assembly including a piece of equipment and a cartridge, and a system including a cartridge and a wireless communication module.

The invention has numerous advantages.

It allows a user to have available a wireless communication assembly, particularly one installed aboard an aircraft (for example of the airplane or helicopter type) for onboard-to-ground data exchange, (between the aircraft and a center located on the ground, for example after landing) and/or onboard-to-onboard exchange (within one and the same aircraft), particularly of avionics data.

This communication can be machine-to-machine oriented (without human intervention) or machine-to-user (for example via the use of a human interface tool of the portable maintenance terminal type (PMAT, tablet, PDA, etc.).

It allows technological evolution of the communication modules of the assembly (particularly as regards the associated wireless communication protocols, such as WiFi, Telecom 3/4G, ZigBee . . . ), and the assembly is consequently resistant to obsolescence. The technology of the modules can therefore be changed without impact on the host equipment of the assembly.

It is possible in particular to use known standard commercially available wireless communication modules.

However, only the designer of the host equipment certifies and qualifies the known standard equipment which can be integrated into the equipment according to the invention, particularly during a functional and environmental validation phase. Only the designer of the host equipment designs or adapts drivers which are allowed to be incorporated into the equipment. Integration of modules not previously certified and qualified is thus prohibited, thanks to a cryptographic signature, which ensures the safety of the assembly.

A given type of module can be integrated into several different types of cartridges, each of the cartridges being specific to a mission profile to be accomplished.

The equipment thus allows optimization of roaming and of communication costs depending on the countries passed through during the mission and depending on the telecommunication network operators.

Moreover, a great variety of different cartridges can be installed on board the aircraft.

Each cartridge of the invention is easy and flexible to use. It is easily changeable on board the aircraft by an inexperienced user.`

Moreover, each cartridge is evolutionary and easily reconfigurable or modifiable by an inexperienced user based on the modules incorporated into it.

PRESENTATION OF THE FIGURES

Figure 4:
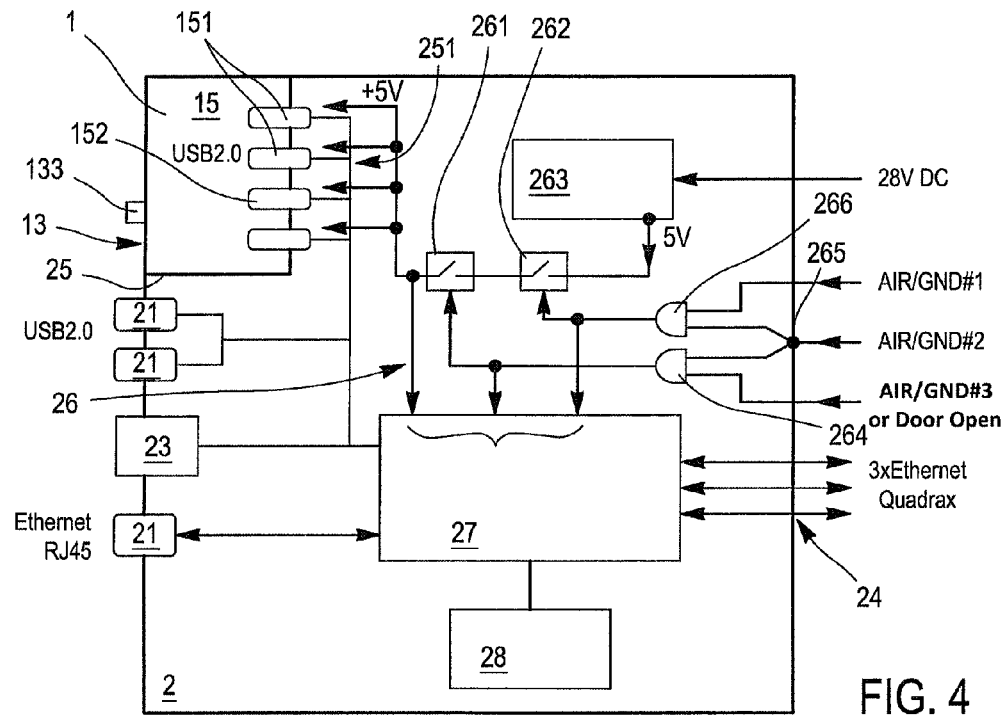
Figure 2:
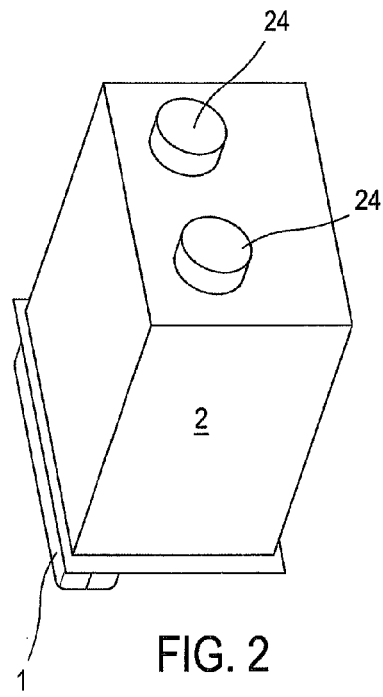
Figure 3:
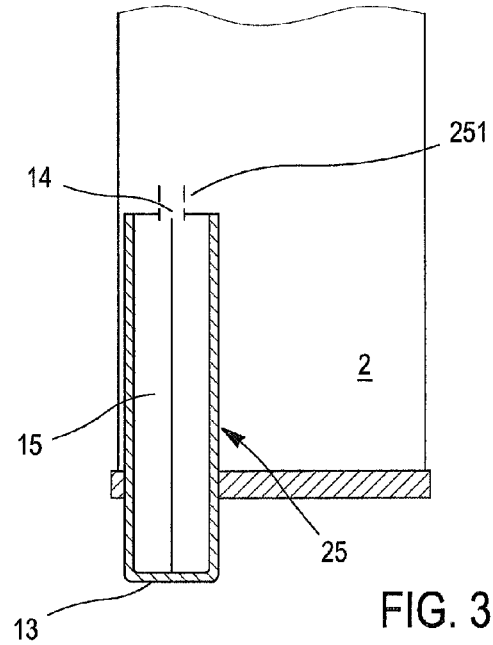
Figure 5:
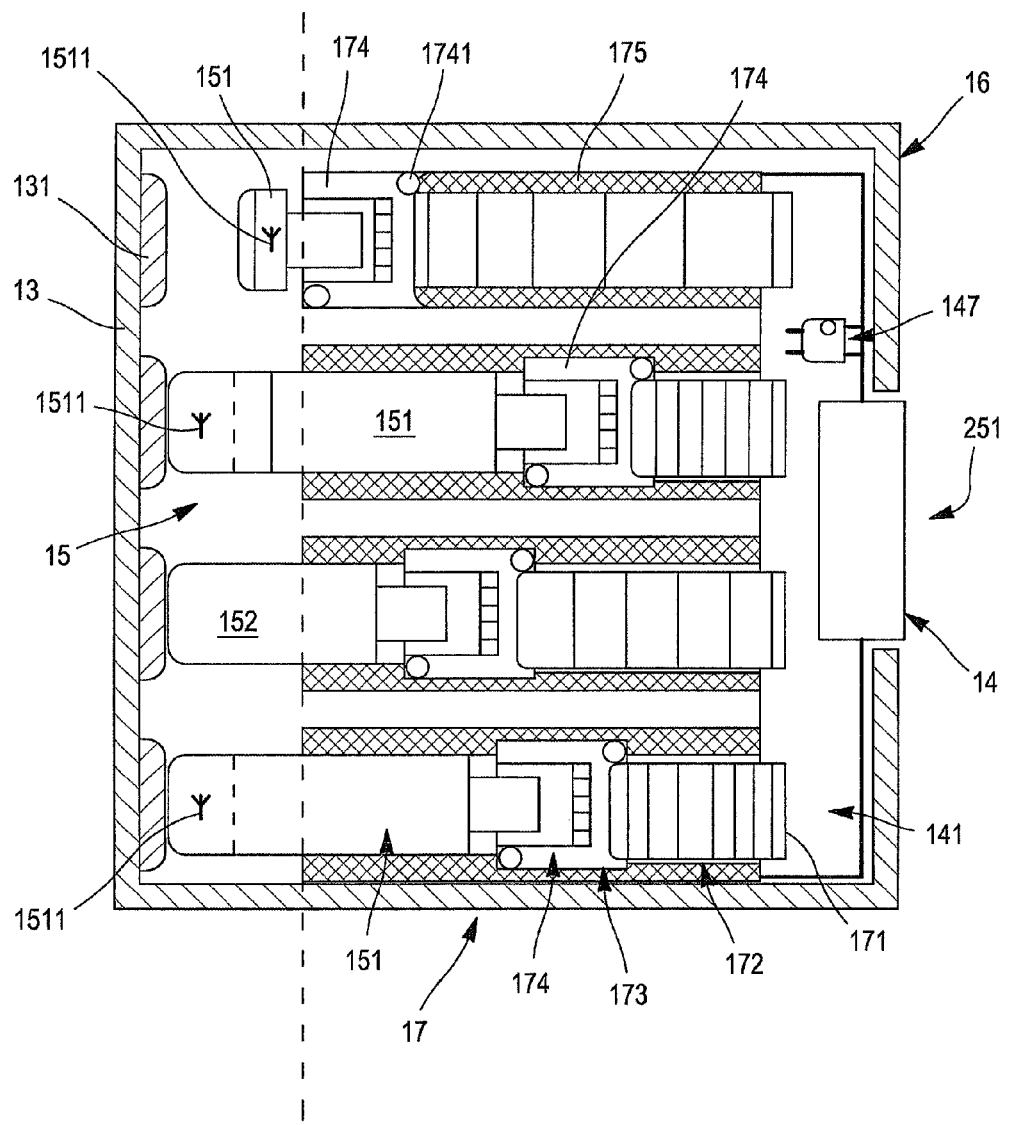
Figure 6:
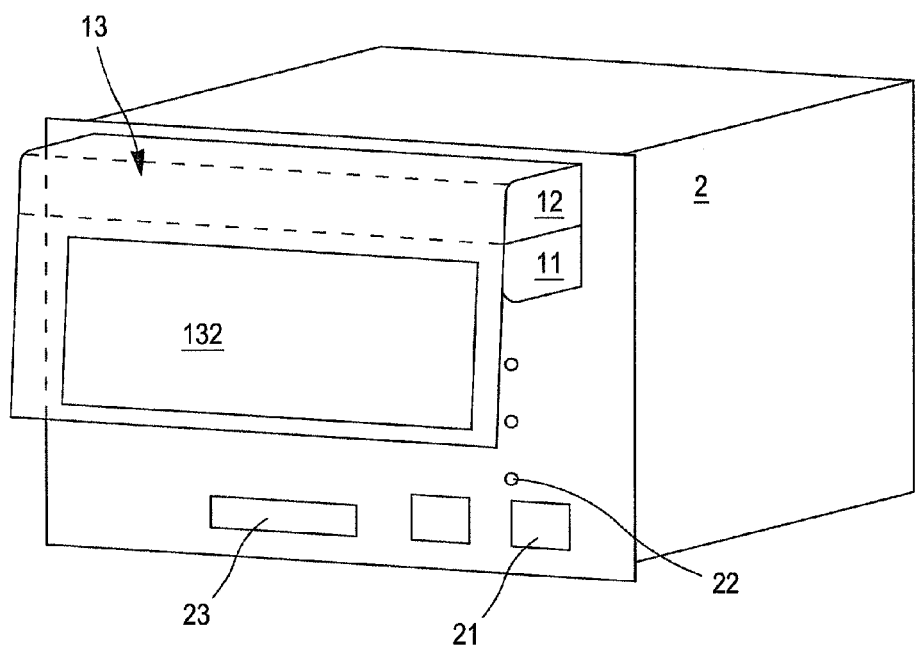

Other features, objects and advantages of the invention will appear from the description that follows, which is purely illustrative and not limiting, and which must be read with reference to the appended drawings wherein:

FIG. 1 shows schematically a front view and a perspective view of an assembly according to the invention, FIG. 2 shows schematically a rear view and a perspective view of an assembly according to the invention, FIG. 3 shows schematically a longitudinal section view of an assembly according to the invention, FIG. 4 shows schematically some components of an assembly according to the invention, FIG. 5 shows schematically an interior space of a cartridge according to the invention, and FIG. 6 shows schematically a front perspective view of a variant of an assembly according to the invention.

In all the figures, similar elements bear identical numerical references.

DETAILED DESCRIPTION

FIGS. 1, 2 and 3 shows schematically an assembly comprising firstly, a possible embodiment of a communication cartridge 1, and additionally, a possible embodiment of a piece of host equipment 2.

The equipment 2 includes a housing having in particular a front face and a rear face.

Preferably but without limitation, the equipment 2 consists of a unit for acquiring, processing and communicating avionics data of an aircraft, for securing said data, for on-board/ground communication, etc.

In the case of an acquisition, processing and communication unit for avionics data of an aircraft, and as shown in FIG. 4, the equipment 2 comprises a processor 27 and a mass memory 28 connected to the processor 27, known in se by a person skilled in the art for the acquisition, processing and communication of avionics data, such as:

A/C exploitation manuals;
the data loading files repository;
virtual Quick Access QAR/DAR Recorders;
A/C flight reports;
maintenance data . . . .

The rear face of the equipment 2 advantageously comprises rear connectors 24 connected to the processor 27, particularly for electrical power supply to the equipment and exchanging for example with another piece of equipment of the aircraft. To this end, the connectors 24 advantageously comprise Ethernet links, for example of the Quadrax type,
discrete conductors of electrical signals 265, the electrical signals 265 indicating for example that the aircraft has landed thanks to a signal 265 corresponding to
landing (Air/Gnd (Ground) signal) or
weight-on-wheels or
door open, and
electrical power supply, for example 28V direct current.

Likewise, the front face of the equipment 2 advantageously comprises at least one connector 21 connected to the processor 27, for example of the known USB type (2.0 for example) and/or Ethernet (for example RJ45). It can also comprise a removable memory 23 and/or status indicator lights 22 (light-emitting diodes, for example).

The equipment comprises, preferably on its front face, a recess 25.

The recess 25 is configured to removably integrate the communication cartridge 1 in normal operation.

Conversely, of course, the cartridge 1 is configured to be removably integrated into the recess 25 of the host equipment 2, in normal operation.

The cartridge 1 also comprises an internal space 15 defined between the walls of the cartridge 1.

It also comprises at least one front port 17, placed in the internal space 15 of the cartridge 1.

The port 17 is configured to cooperate with at least one wireless communication module 151, also placed inside the internal space 15 of the cartridge 1, in normal operation.

In the rest of the present description, a system comprises on the one hand the cartridge 1, and on the other at least one module 151.

The module 151 conventionally comprises a memory allowing storage of data, and conventional data processing means.

The module 151 comprises an antenna 1511 for wireless transmission of data stored in the memory of the module 151.

The module 151 is advantageously but without limitation of the USB key type, to with a medium removable from the port 17, containing a flash memory and allowing data storage. In this case, of course, the port 17 is also of the USB type.

Advantageously, the cartridge 1 comprises at least one USB port 17, but each of the ports 17 can be in conformity with a different technology of the USB technology. The cartridge 1 can also comprise at least one port 17 according to the known technologies PCI express (PCIe), RS-232C, I$^2$C (Inter Integrated Circuit), SPI (Serial Peripheral Interface) . . . .

The cartridge 1 comprises an outer front portion 13 configured to be external to the recess 25, in normal operation, that is when the cartridge 1 is integrated into the recess.

Thus about ⅔ of the cartridge 1 can be inserted into the recess 25, and the portion 13 can constitute ⅓ of the cartridge.

It is understood that to allow wireless transmission of the data, the antenna 1511 must be positioned in the outer front portion 13 of the cartridge 1, in normal operation. The cartridge 1 thus allows electromagnetic radiation from the antennas 1511 of the modules 151.

Each of the modules 151 comprising an antenna 1511 can be in conformity, without limitation, with a WiFi, Telecom cellular 3G or 4B, or Zigbee technology, for example.

The front port 17 is configured to have an adjustable position in the internal space 15, such that any module is at least partially positioned in the front outer portion 13 of the cartridge 1, in normal operation, particularly an antenna 1511 of a communication module 151. The adjustable position of each of the ports 17 thus allows the internal space 15 to accommodate several module formats, while allowing electromagnetic radiation from the antennas 1511 of the communication modules 151.

To this end, the front port 17 advantageously comprises a connector 174 (USB type for example) mounted in translation in the internal space 15 and connected to the rear connector 14 via a flexible cable 172.

The connector 174 is for example mounted in translation on rails 175 located on either side of the connector 174.

Screws 1741 located on the connector 174 allow the connector 174 to be immobilized on the rails 175.

The cable 172 is for example of the accordion cable type, and is located between two connections, to with a connection 173 to the connector 174 and a connection 171 to the connector 14.

Advantageously, the cartridge 1 comprises a module blocker 131 longitudinally aligned with the front port 17, particularly for avoiding vibrations of a module during a flight of the aircraft for example. The blocker 131 can be made of elastomeric material, and conformed to the end of a module.

According to a possible variant not shown in the figures, the part 13 comprises a recess external to the cartridge 1, for insertion of an antenna external to the module and/or a connector for an external antenna.

Advantageously, the cartridge 1 comprises a plurality of ports 17.

As shown by FIGS. 4 and 5, the cartridge 1 preferably but without limitation comprises four ports 17 configured for
- a first module 151 in a first format, to with a length of only a few millimeters, and comprising a communication antenna 1511,
- a second module 151 in a second format, for example 65 mm long, and comprising a communication antenna 1511,
- a third module 152 in a third format, on the order of 40 mm long for example, and comprising only a memory for storing data, with no antenna, and
- a fourth module 151 in a fourth format, on the order of 50 mm long for example, and comprising a communications antenna 1511.

The configuration of FIG. 5 can correspond to a given profile of a mission to be accomplished. The assembly therefore allows optimization of roaming and of communication costs according to the countries passed through during the mission and according to the operators of telecommunication networks, because it makes it possible to pass from one operator to another, or from one communication technology to another.

A user of the invention can easily modify the configuration of FIG. 5 by replacing the modules in the cartridge 1. Each cartridge is evolutionary and easily reconfigurable or modifiable by a user with little experience, depending on the modules integrated into it.

To this end, the cartridge 1 principally comprises a base 11 and a lid 12 cooperating mechanically with the base 11 to form the walls of the cartridge 1, and to open and/or close the cartridge 1, and thus allow easy access to the interior space 15.

A user of the invention can also provide a kit comprising a plurality of different systems (for example a system with four modules, a system with five modules, and a system with three modules), so as to be able to correspond to a plurality of mission profiles. Each cartridge 1 is easily replaceable on board the aircraft by a user with little experience. The cartridge 1 can thus have an outer shape such that only one orientation for integration into the recess 25 is possible.

The processor 27 of the equipment 2 is configured to be able to identify the different modules of a system and/or the different systems of a kit, via a connector 251 of the recess 25 connected to
- a rear connector 14 of the cartridge comprising a card 141, and to
- an identification logic 147 of the cartridge 1.

To this end, the processor 27 comprises an I2C E2PROM circuit and/or logic signal loopback and/or a set of DIP type switches of known type, for example.

The modules are preferably known standard commercially available wireless communication modules and can be of different origins and/or different manufacturers and/or different technologies.

As seen above, without limitation, the system can comprise at least one storage module 152 (the third module 152 in the example of FIG. 4) [which] comprises a storage system which stores drivers previously certified and qualified by the initial designer of the equipment for each of the communication modules 151. Only the designer of the host equipment designs the drivers of the modules which can be integrated into the equipment thanks to a cryptographic signature. The integration of modules not previously certified is thus prohibited, which ensures the safety of the assembly.

However, the modules 151 generally also comprise a storage space, which makes the modules 152 optional, the drivers previously certified and qualified by the initial designer of the equipment, for each of the communication modules 151, being directly storable on the modules 151.

The equipment comprises a logic circuit 26 for electrical power supply to the cartridge 1.

Thus, when the equipment 2 constitutes an acquisition, processing and communication unit for avionics data of an aircraft, the logic circuit 26 is configured to cut off the power supply to the cartridge 1 when the aircraft is in flight.

To this end, the circuit 26 comprises principally
- a voltage source 263, connected to the power supply of the equipment 2, delivering 5V direct current for example,
- the connector 251 of the recess 25, configured to cooperate with the rear connector 14 of the cartridge 1, and
- at least one first switch 261 and a second switch 262 placed in series with one another between the source 263 and the connector 251.

The logic circuit 26 also comprises
- a first AND logic gate 264 controlling the first switch 261, and
- a second AND logic gate 266 commanding the second switch 262.

The gates 264 and 266 are configured to receive as input at least two discrete electrical signals 265 indicating that the aircraft has landed.

Each gate 264 or 266 is conducting when it receives at its input at least two different discrete signals indicating that the aircraft is no longer in flight (for example AIR/GND#1 and AIR/GND#2 for gate 266, and AIR/GND#2 and AIR/GND#3 or Door Open for gate 264). There is consequently redundancy in the discrete signals 265.

The conducting gate 264 or 266 closes respectively the first switch 261 or the second switch 262.

The switches 261 and 262 being in series, both switches 261 and 262 must be closed to allow power supply to the cartridge 1. There is consequently also redundancy in the switches 261 and 262, and power supply to the cartridge 1 is therefore not possible in flight.

The processor 27 is informed of the opening or closing of the switches 261 or 262.

Preferably, the outer part 13 of the cartridge 1 comprises an indicator light 133 which lights when activity of the modules 151 is permitted.

Likewise, the cartridge 1 can support as an option, as shown in FIG. 6, a display 132 on the front outer portion 13.

The display 132 can be of the screen type, preferably a touch-screen.

The invention claimed is:

1. A communication cartridge (1)
   configured to be removably integrated into a recess (25) of host equipment (2), in normal operation, an outer front portion (13) of the cartridge being configured to be external to the recess (25) of the host equipment (2), and said communication cartridge
   comprises at least one front port (17), placed in an internal space (15) of the cartridge (1) and configured to cooperate with a wireless communication module (151) also placed in the internal space (15) of the cartridge (1), in normal operation, and
   the front port (17) is configured to have an adjustable position in the internal space (15), such that the module (151) is at least partially positioned in the outer front portion (13) of the cartridge (1), in normal operation.

2. The cartridge (1) according to claim 1, comprising a base (11) and a lid (12) cooperating mechanically with the base (11) to open and/or close the cartridge (1).

3. The cartridge (1) according to claim 1 or claim 2, comprising a rear connector (14) placed in the internal space (15) and adapted through the cartridge (1) to cooperate with a connector (251) of the recess (25), and wherein
   the front port (17) comprises a connector (174) mounted in translation in the internal space (15) and connected to the rear connector (14) via a flexible cable (172).

4. The cartridge according to claim 1 or claim 2, comprising a module (151, 152) blocker (131) longitudinally aligned with the front port (17).

5. The cartridge according to claim 1 or claim 2, comprising a display (132) on the outer front portion (13).

6. The cartridge according to claim 1 or claim 2, wherein the front port (17) is a USB port or a PCIe port.

7. The cartridge according to claim 1 or claim 2, comprising identification logic (147) for the cartridge (1).

8. The cartridge according to claim 1 or claim 2, wherein the front outer portion (13) comprises
   a recess external to the cartridge (1) for insertion of an antenna external to a module (151) and/or a connector for an external antenna.

9. Host equipment (2) constituting an acquisition, processing and communication unit for avionics data of an aircraft, comprising a recess (25) configured to, in normal operation, removably integrate a communication cartridge (1) according to claim 1 or claim 2, the cartridge comprising a front outer portion (13) configured to be external to the recess (25), and
   a logic circuit (26) for power supply to the cartridge (1), the cartridge (1) power supply logic circuit (26) being configured to cut off power supply to the cartridge (1) when the aircraft is in flight.

10. Equipment according to claim 9, wherein the logic circuit (26) comprises
    a voltage source (263),
    a connector (251) of the recess (25) configured to cooperate with a rear connector (14) of the cartridge (1), and
    at least a first switch (261) and a second switch (262) placed in series with one another between the source (263) and the connector (251), the first switch (261) and the second switch (262) each being controlled by a logic gate (264, 266) configured to receive as inputs at least two discrete electrical signals (265).

11. Equipment according to claim 9 or claim 10, comprising a processor (27) comprising an I2C E2PROM circuit and/or a logic signal loopback and/or a set of switches.

12. An assembly, comprising at least one cartridge (1)
    configured to be removably integrated into a recess (25) of host equipment (2), in normal operation, an outer front portion (13) of the cartridge being configured to be external to the recess (25) of the host equipment (2), and said communication cartridge
    comprises at least one front port (17), placed in an internal space (15) of the cartridge (1) and configured to cooperate with a wireless communication module (151) also placed in the internal space (15) of the cartridge (1), in normal operation, and
    the front port (17) is configured to have an adjustable position in the internal space (15), such that the module (151) is at least partially positioned in the outer front portion (13) of the cartridge (1), in normal operation and an equipment according to claim 9.

13. A system, comprising at least one cartridge (1) according to claim 1 or claim 2 and at least one wireless communication module (151).

14. The system according to claim 13, comprising a storage space (151, 152) which stores driver software previously certified and qualified for the communication module (151) and having a cryptographic signature.

* * * * *